(12) United States Patent
Cobb et al.

(10) Patent No.: US 6,335,128 B1
(45) Date of Patent: Jan. 1, 2002

(54) METHOD AND APPARATUS FOR DETERMINING PHASE SHIFTS AND TRIM MASKS FOR AN INTEGRATED CIRCUIT

(76) Inventors: Nicolas Bailey Cobb, 1632 Willow Lake La., San Jose, CA (US) 95131-3553; Kyohei Sakajiri, 2129 SW. Harbor Pl., Portland, OR (US) 97201

(*) Notice: Subject to any disclaimer, the term of this patent is extended or adjusted under 35 U.S.C. 154(b) by 0 days.

(21) Appl. No.: 09/407,447

(22) Filed: Sep. 28, 1999

(51) Int. Cl.⁷ .............................. G03F 9/00; G06F 17/50
(52) U.S. Cl. ........................................ 430/5; 716/21
(58) Field of Search .................... 430/5, 322, 394; 359/500.22; 716/19, 21

(56) References Cited

U.S. PATENT DOCUMENTS

| | | | |
|---|---|---|---|
| 4,762,396 A | 8/1988 | Dumant et al. | 350/320 |
| 5,302,477 A | 4/1994 | Dao et al. | 430/5 |
| 5,308,741 A | 5/1994 | Kemp | 430/5 |
| 5,328,807 A | 7/1994 | Tanaka et al. | 430/311 |
| 5,352,550 A | 10/1994 | Okamoto | 430/5 |
| 5,364,716 A | 11/1994 | Nakagawa et al. | 430/5 |
| 5,537,648 A | 7/1996 | Liebmann et al. | 395/500 |
| 5,563,012 A | 10/1996 | Neisser | 430/22 |
| 5,573,890 A | 11/1996 | Spence | 430/311 |
| 5,620,816 A | 4/1997 | Dao | 430/5 |
| 5,636,131 A | 6/1997 | Liebmann et al. | 364/490 |
| 5,663,017 A | 9/1997 | Schinella et al. | 430/5 |
| 5,702,848 A | 12/1997 | Spence | 430/5 |
| 5,766,806 A | 6/1998 | Spence | 430/5 |
| 5,795,685 A | 8/1998 | Liebmann et al. | 430/5 |
| 5,807,649 A | 9/1998 | Liebmann et al. | 430/5 |
| 5,858,580 A | 1/1999 | Wang et al. | 430/5 |
| 5,883,813 A | 3/1999 | Kim et al. | 716/19 |
| 6,057,063 A * | 5/2000 | Liebmann et al. | 430/5 |

FOREIGN PATENT DOCUMENTS

| | | |
|---|---|---|
| EP | 0698916 A2 | 2/1996 |
| GB | 2333613 A | 7/1999 |

OTHER PUBLICATIONS

Asai et al., "High Performance Optical Lithography Using a Separated Light Source," J. Vac. Sci. Technol. 10(6), Nov./Dec. 1992, pp. 3023–3026.

Brock et al., "Fabrication of Grooved Glass Substrates by Phase Mask Lithography," J. Vac. Sci. Technol. 10(6), Nov./Dec. 1991, pp. 3155–3161.

Brunner et al., "170 nm Gates Fabricated by Phase–Shift Mask and Top Anti–Reflector Process," SPIE vol. 1927, 1993, pp. 182–189.

Brunner, T.A., "Rim Phase–Shift Mask Combined with Off–Axis Illumnation: A Path to 0.5λ/NA Geometries," SPIE vol. 1927, 1993, pp. 54–62.

Chang et al., "Computer–Aided Optimal Design of Phase–Shifting Mask," SPIE vol. 1674, 1992, pp. 65–72.

(List continued on next page.)

Primary Examiner—S. Rosasco
(74) Attorney, Agent, or Firm—Blakely Sokoloff Taylor & Zafman LLP

(57) ABSTRACT

A method and apparatus for deep sub-micron layout optimization is described. Components of an integrated circuit (IC) design (e.g., gates) can be identified and manufactured using a phase shifting process to improve circuit density and/or performance as compared to a circuit manufactured without using phase shifting processes. In one embodiment, a first mask (e.g., a phase shift mask) is generated that includes the component to be manufactured using the phase shifting process. A second mask (e.g., a trim mask) is also generated to further process the structure created using the first mask. Both masks are defined based on a region (e.g., a diffusion region) in a different layer of the integrated circuit layout than the structure (e.g., the gate) being created with the phase shifting process.

26 Claims, 8 Drawing Sheets

OTHER PUBLICATIONS

Debaene et al., "A Novel Technique for the Control of Resist Profiles When Exposing with Steppers," SPIE vol. 811, 1987, pp. 70–76.

Galan et al., "Application of Alternating–Type Phase Shift Mask to Polysilicon Level for Random Logic Circuits," Jpn. J. Appl. Phys. vol. 33, Dec. 1994, pp. 6779–6784.

Garofalo et al., "Mask Assisted Off–Axis Illumination Technique for Random Logic," J. Vac. Sci. Technol. B 11(6), Nov./Dec. 1993, pp. 2651–2658.

Hunter et al., "A New Edge–Defined Approach for Submicrometer MOSFET Fabrication," IEEE Electron Device Letters, vol. EDL–2, No. 1, Jan. 1981, pp. 4–6.

Hunter et al., "New Edge–Defined Vertical–Etch Approaches for Submicrometer MOSFET Frabrication," IEEE, pp. 764–767.

Inokuchi et al., "Sub–Quarter Micron Gate Fabrication Process Using Phase–Shifting–Mask for Microwave GaAs Devices," Extended Abstracts of the 1991 International Conference on Solid State Devices and Materials, Yokonama, 1991, pp. 92–94.

Inokuchi et al., "Sub–Quarter Micron Gate Fabrication Process Using Phase–Shifting–Mask for Microwave GaAs Devices," Japanese Journal of Applied Physics, vol. 30, No. 12B, Dec. 1991, pp. 3818–3821.

Ipri, A.C., "Sub–Micron Polysilicon Gate CMOS/SOS Technology," pp. 46–49.

Jinbo, Hideyuki and Yamashita, Yoshio, "0.2 $\mu$m or Less i–Line Lithography by Phase–Shifting–Mask Technology," International Electron Devices Meeting, Dec. 9–12, 1990, pp. 785, 825–828.

Jinbo, Hideyuki and Yamashita, Yoshio, "Improvement of Phase–Shifter Edge Line Mask Method," Japanese Journal of Applied Physics, vol. 30, No. 11B, Nov. 1991, pp. 2998–3003.

Jinbo et al., "Sub–Half–Micron i–Line Lithography by Use of LMR–UV Resist," Japanese Journal of Applied Physics, vol. 28, No. 10, Oct. 1989, pp. 2053–2057.

Jinbo et al., "Subhalf–Micron Patterning of Negative Working rEsist by Using New Phase–Shifting Masks," J. Vac. Sci. Technol. B 8(6), Nov./Dec. 1990, pp. 1745–1748.

Kim et al., "Application of Alternating Phase Shift Mask to Device Fabrication," SPIE vol. 2440, pp. 515–523.

Kimura, Tamotsu, and Ohshima, Tomoyuki, "Schottky Characteristics of Subhalf–Micron Gate GaAs Metal–Semiconductor Field–Effect Transistor," Jpn. J. Appl. Phys. vol. 32, Feb. 1993, pp. L 183–L 186.

Kimura et al., "Subhalf–Micron Gate GaAs MESFET Process Using Phase–Shifting–Mask Technology," GaAs IC Symposium Technical Digest 1991, Oct. 20–23, 1991, pp. 281–284.

Kiriha et al., "An Automatic Generation of Mangement Information Base (MIB) for OSI Based Network Mangement System," Globecom '91, IEEE, 1991, pp. 649–653.

Liebmann et al., "A Comprehensive Evaluation of major Phase Shift Mask Technologies for Isolated Gate Structures in Logic Designs," SPIE vol. 2197, pp. 612–623.

Liu et al., "Fabrication of 0.1 $\mu$m T–shaped Gates by Phase–Shifting Optical Lithography," SPIE vol. 1927, pp. 42–52.

Liu, Hua–Yu, "The Application of Alternating Phase–Shifting Masks to 140nm Gate Patterning: Line Width Control Improvements and Design Optimization," SPIE vol. 3236, pp. 328–337.

Liu et al., "Systematic Design of Phase–Shifting Masks with Extended Depth of Focus and/or Shifted Focus Plane," SPIE vol. 1674, 1992, pp. 14–52.

Liu et al., "Systematic Design of Phase–Shifting Masks with Extended Depth of Focus and/or Shifted Focus Plane,", IEEE Transactions on Semiconductor Manufacturing, vol. 6, No. 1, Feb. 1993, pp. 1–21.

Moniwa et al., "Algorithm for Phase–Shift Mask Design with Priority on Shifter Placement," Jpn. J. Appl. Phys. vol. 32, Dec. 1993, pp. 5874–5879.

Nakagawa et al., "Fabrication of 64m Dram with i–Line Phase–Shift Lithography," IEEE, 1990, pp. 817–820.

Nakagawa et al., "Mask Pattern Designing for Phase–Shift Lithography," IEEE, 1991, pp. 51–54.

Nashold, Karen M., and Saleh, Bahaa E. A., "Image Construction Through Diffraction–limited High–Contrast Imaging Systems: An Iterative Approach," J. Opt. Soc. Am. A, vol. 2, No. 5, May 1985, pp. 635–643.

Ohtsuka et al., Conjugate Twin–Shifter for the New Phase Shift Method to High Resolution Lithography, SPIE vol. 1463, 1991, pp. 112–123.

Ohtsuka et al., "Conjugate Twin–Shifter Masks with Multiple Focal Planes," SPIE vol. 1674, 1992, pp. 53–64.

Ohtsuka et al., "Diagonal Phase Errors Affecting Optical Intensity in Phase Defect Repair Elements," Jpn. J. Appl. Phys., vol. 32, Dec. 1993, pp. 5892–5899.

Onodera et al., "Conjugate Twin–Shifter Phase Shift Method for High Resolution Lithography," OKI Technical Review 148, vol. 59, Dec. 1993, pp. 47–50.

Ooi et al., "Computer Aided Design Software for Designing Phase–Shifting Masks," Jpn. J. Appl. Phys. vol. 32, Pt. 1, No. 12B, 1993, pp. 5887–5891.

Ooi et al., "Method of Designing Phase–Shifting Masks Utilizing a Compactor," Jpn. J. Appl. Phys. vol. 33, Pt. 1, No. 12B, 1994, pp. 6774–6778.

Pati, Y.C., and Kailath, T., "Phase–Shifting Masks for Microlithography: Automated Design and Mask Requirements," J. Opt. Soc. Am. A. vol. 11, No. 9, Sep. 1994, pp. 2438–2452.

Pforr et al., "Feature Biasing Versus Feature–Assisted Lithography—A Comparison of Proximity Correction Methods for 0.5*($\mu$/NA) Lithography," SPIE vol. 2440, pp. 150–167.

Prouty, Mark D., and Neureuther, Andrew P., "Optical Imaging with Phase Shift Masks," SPIE vol. 470, 1984, pp. 228–232.

Rieger, M. L., and Shaw, A., "Lithographic Alternatives to PSM Repair," SPIE vol. 1674, pp. 609–617.

Ronse et al., "Comparison of Various Phase Shift Strategies and Application to 0.35 $\mu$m ASIC Designs," SPIE vol. 1927, pp. 2–16.

Saleh, Bahaa E. A., and Nashold, Karen M., "Image Construction: Optimum Amplitude and Phase Masks in Photolithography," Applied Optics, vol. 24, No. 10, May 15, 1985, pp. 1432–1437.

Saleh, Bahaa E. A., and Subotic, Nikola S., "Pre–Inverse Filtering of Distorted Images," Applied Optics, vol. 20, No. 22, Nov. 15, 1981, pp. 3912–3916.

Saleh, Bahaa E. A., and Sayegh, Soheil I., "Reduction of Errors of Microphotographic Reproductions by Optimal Corrections of Original Masks," Optical Engineering, Vo. 20, No. 5, Sep./Oct. 1981, pp. 781–784.

Shibuya et al., "Performance of Resolution Enhancement Technique Using Both Multiple Exposure and Nonlinear Resist," Jpn. J. Appl. Phys. vol. 33, Dec. 1994, pp. 6874–6877.

Studebaker, Lawrence G., "Sub–0.2 Micron Gate Lithography Using E–Beam, X–Ray and Optical Technologies—An Overview," IEEE, GaAs IC Symposium, 1994, pp. 321–324.

Sugiura et al., "The Application of Phase–Shifting Mask to DRAM Cell Capacitor Fabrication," SPIE, vol. 1927, 1993, pp. 79–88.

Tamechika et al., "Resolution Improvement Using Auxiliary Pattern Groups in Oblique Illumination Lithography," Jpn. J. Appl. Phys., vol. 32, Dec. 1993, pp. 5856–5862.

Terasawa et al., "0.3–Micron Optical Lithography Using a Phase–Shifting Mask," SPIE, vol. 1088, 1989, pp. 25–33.

Terasawa et al., "Improved Resolution of an i–Line Stepper Usign a Phase–Shifting Mask," J. Vac. Sci. Technol. B 8(6), Nov./Dec. 1990, pp. 1300–1309.

Terasawa et al., "Variable Phase–Shift Mask for Deep Sub–Micron Optical Lithography," SPIE, vol. 1463, 1991, pp. 197–206.

Toh et al., "Design Methodology for Dark–Field Phase–Shifted Masks," SPIE, vol. 1463, 1991, pp. 402–408.

Toh et al., "Optical Lithography with Chromeless Phase–Shifted Masks," SPIE, vol. 1463, pp. 74–86.

Uchino et al., "Azide–Novolak Resin Negative Photoresist for i–Line Phase–Shifting Lihtography," J. Vac. Sci. Technol. B 9(6), Nov./Dec. 1991, pp. 3162–3165.

Waas et al., "Automatic Generation of Phase Shift Mask Layouts," Microelectronic Engineering 23, 1994, pp. 139–142.

Watanabe et al., "2×2 Phase Mask for Arbitrary Pattern Formation," Jpn. J. Appl. Phys., vol. 33, Dec. 1994, pp. 6790–6795.

Watanabe et al., "Sub–Quarter–Micron Gate Pattern Fabrication Using a Transparent Phase Shifting Mask," J. Vac. Sci. Technol. B 9(6), Nov./Dec. 1991, pp. 3172–3175.

Watanabe et al., "Transparent Phase Shifting Mask," IEEE, IEDM, 1990, pp.821–824.

Watanabe et al., "Transparent Phase Shifting Mask with Multistage Phase Shifter and Comb–Shaped Shifter," SPIE, vol. 1463, 1991, pp. 101–110.

White, V., and Cerrina, F., "Metal–less X–Ray Phase–Shift Masks for Nanolithography," J. Vac. Sci. Technol. B 10(6), Nov./Dec. 1992, pp. 3141–3143.

Yamanaka et al., "A 5.9$\mu$m$^2$ Super Low Power Sram Cell Using a New Phase–Shift Lithography," IEEE, IEDM, 1990, pp. 477–480.

Yanagishita et al., "Phase–Shifting Photolithography Applicable to Real IC Patterns," SPIE, vol. 1463, 1991, pp. 207–216.

* cited by examiner

METHOD AND APPARATUS FOR DETERMINING PHASE SHIFTS AND TRIM MASKS FOR AN INTEGRATED CIRCUIT

FIELD OF THE INVENTION

The invention relates to integrated circuit processing. More particularly, the invention relates to optical correction for deep sub-micron (<0.25 µm) integrated circuit processes.

BACKGROUND OF THE INVENTION

As integrated circuits (ICs) become more dense, the widths of lines and components, as well as the separation between lines becomes increasingly smaller. Currently, deep sub-micron (<0.25 µm) processes are being used. However, with deep sub-micron processes, silicon yield is affected by several factors including reticle/mask pattern fidelity, optical proximity effects, and diffusion and loading effects during resist and etch processing. Typical problems include linewidth variations that depend on local pattern density and topology and line end pullback.

FIG. 1a is an exemplary deep sub-micron design layout. FIG. 1a represents the intended layout; however, because of the physics of deep sub-micron processing the resulting circuit is different than the design layout. FIG. 1b is an uncorrected structure based on the design of FIG. 1a.

In the structure of FIG. 1b, line widths vary based on topology and density, which can detrimentially affect speed and accuracy of operation. Line edges are also shortened and rounded, which can break connections and cause circuit failure. U.S. Pat. No. 5,858,580 issued to Wang, et al. ("the "580 patent") discloses a method and an apparatus for reducing gate width from an original size to a reduced size that can be a sub-micron dimension.

The "580 patent reduces gate sizes from a first manufacturing process having a first minimum realizable dimension to a second manufacturing process having a second minimum realizable dimension. The second minimum realizable dimension is less than the first minimum realizable dimension. However, the "580 patent requires an integrated circuit layout to be laid out for a first process and then shrunk for use with a second process. What is needed is improved deep sub-micron processing that can operate on an original circuit layout.

SUMMARY OF THE INVENTION

A method and apparatus for generating a phase shifting mask and a trim mask for integrated circuit manufacture is described. A first mask is generated that defines a first region in a first layer of the integrated circuit. The first region is based, at least in part, on a region in a second layer of the integrated circuit. A second mask is generated that defines a second region in the first layer of the integrated circuit. The second region is also based, at least in part, on the region in the second layer of the integrated circuit. The second mask also removes artifacts generated by the first mask.

BRIEF DESCRIPTION OF THE DRAWINGS

The invention is illustrated by way of example, and not by way of limitation in the figures of the accompanying drawings in which like reference numerals refer to similar elements.

FIG. 1b is an uncorrected structure based on the design of FIG. 1a.

DETAILED DESCRIPTION

A method and apparatus for generating a phase shifting mask and a trim mask for integrated circuit manufacture is described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Methods and apparatuses for deep sub-micron layout optimization are described. Components of an integrated circuit (IC) design (e.g., gates) can be identified and manufactured using a phase shifting process to improve circuit density and/or performance as compared to a circuit manufactured without using phase shifting processes. In one embodiment, a first mask (e.g., a phase shift mask) is generated that includes the component to be manufactured using the phase shifting process. A second mask (e.g., a trim mask) is also generated to further process the structure created using the first mask. Both masks are defined based on a region (e.g., a diffusion region) in a different layer of the integrated circuit layout than the structure (e.g., the gate) being created with the phase shifting process.

Figure 1A:
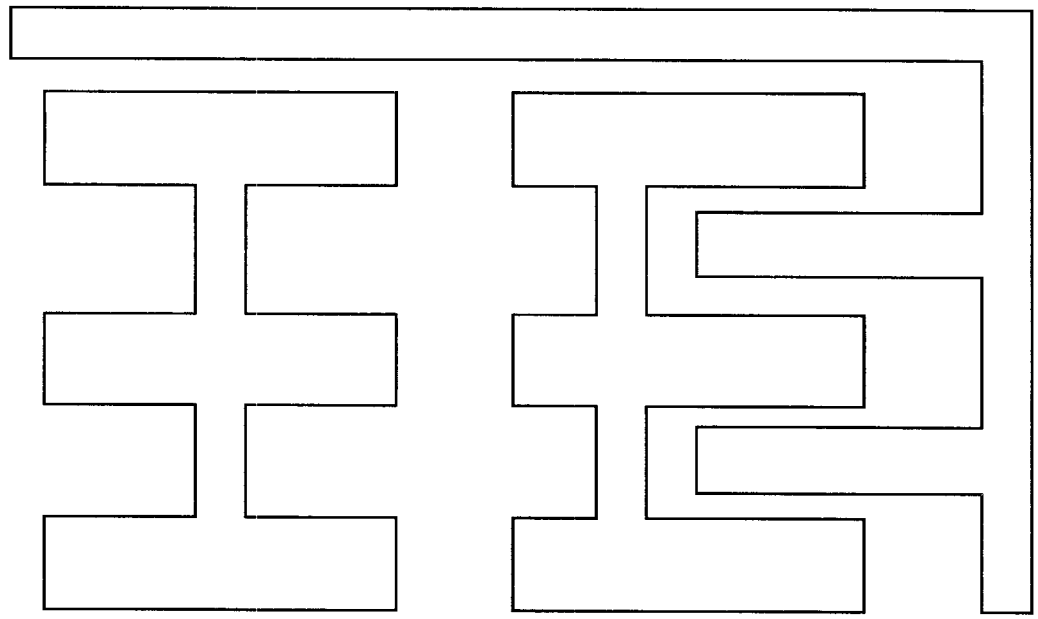
FIG. 1a is an exemplary deep sub-micron design layout.
Figure 1B:
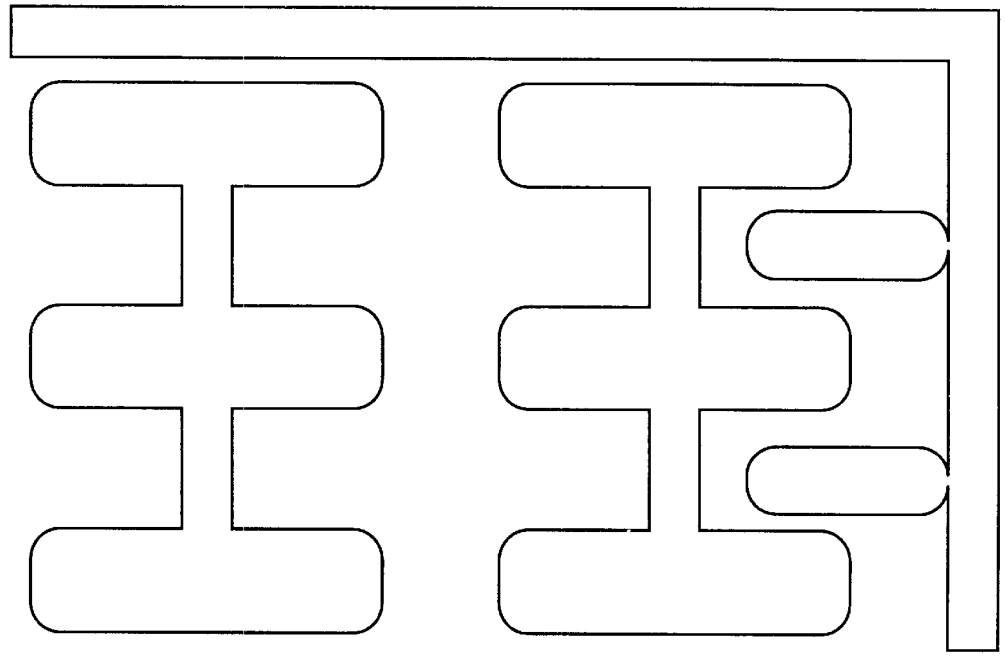
Figure 2:
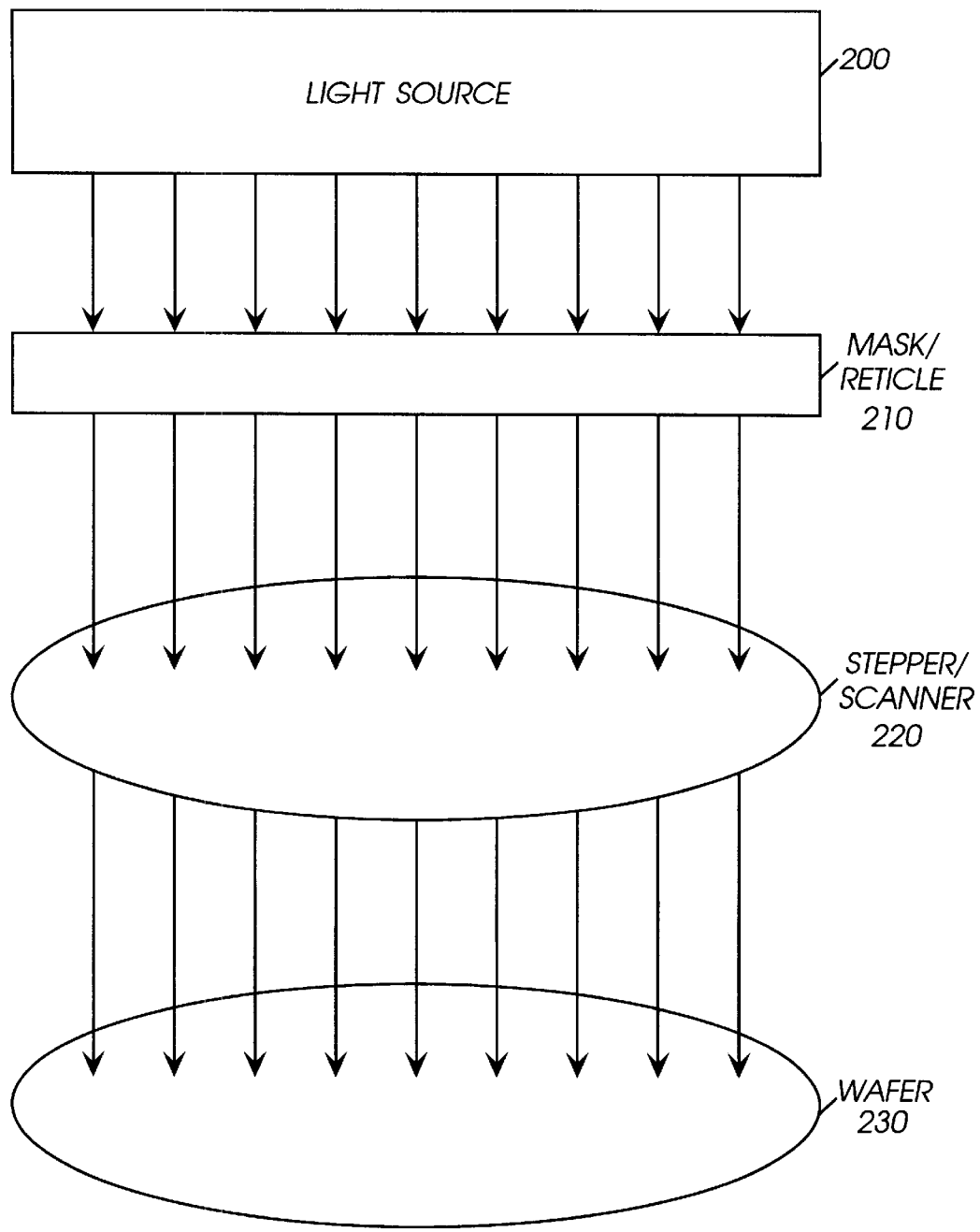
FIG. 2 is one embodiment of an integrated circuit processing arrangement.

FIG. 2 is one embodiment of an integrated circuit processing arrangement. The arrangement of FIG. 2 is suitable for use with the invention and can be used as described below to reduce component sizes. The general uses of the components of FIG. 2 are known in the art. Modifications are described in greater detail below. For example, specific reticle and/or mask configurations and modifications can be used with the remaining components of FIG. 2.

Light source 200 provides light towards wafer 230. Mask/reticle 210 blocks light for certain predetermined portions of wafer 230. Stepper scanner 220 directs the patterns of mask/reticle 210 to one of multiple integrated circuits being developed on wafer 230.

Figure 3:
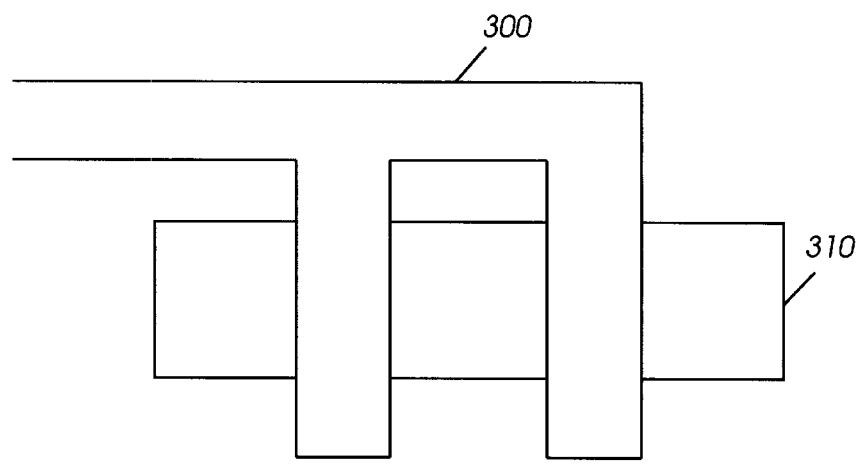
FIG. 3 is a design layout having two gates over a diffusion region.

FIG. 3 is a design layout having two gates over a diffusion region. The layout of FIG. 3 is used herein to describe the invention. However, the usefulness of the invention is not limited to the design of FIG. 3.

Diffusion region 310 can be used, for example, to provide a collector and an emitter for a transistor. Diffusion region 310 can be provided in any manner known in the art. For example, diffusion region 310 can be provided by ion implantation.

Metal (or polysilicon) region 300 provides electrical connectivity between components. For example, metal region 300 provides two gates across diffusion region 310 and a connection for the two gates to another device (not shown in FIG. 3). Metal region 300 can be made, for example, of aluminum, copper, etc.

Figure 4:
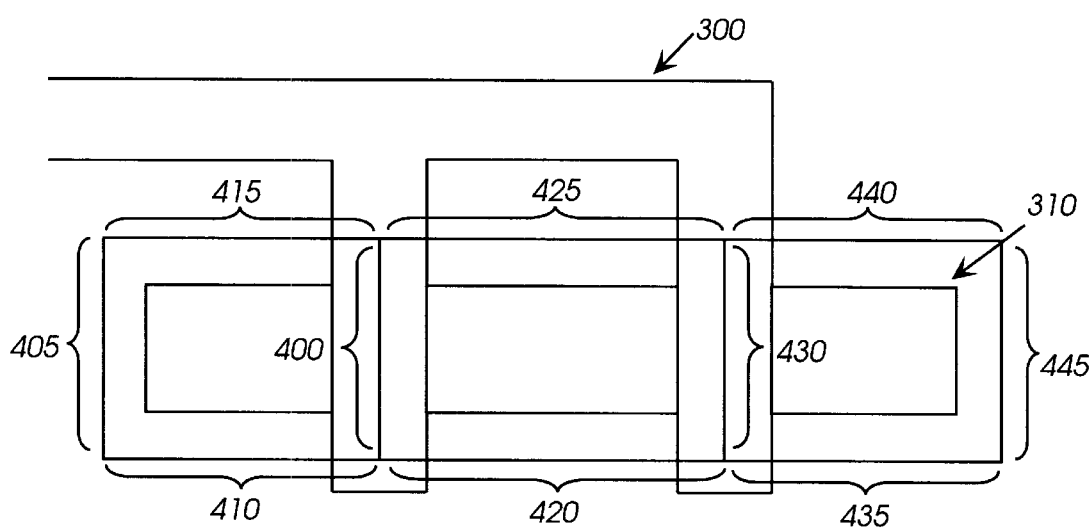
FIG. 4 is the design layout of FIG. 3 with line segment indications used to generate phase shift and trim masks according to one embodiment of the invention.

FIG. 4 is the design layout of FIG. 3 with line segment indications used to generate phase shift and trim masks according to one embodiment of the invention. In one embodiment, the line segments are used to define a region of a phase shift mask. In alternative embodiments, offsets from the line segments are used to define the phase shift mask.

Line segments 405 and 445 are beyond the ends of diffusion region 310. Line segments 400 and 430 correspond to the center of the gates of metal region 300. Line segments 415, 410, 435 and 440 connect the respective end line segments (i.e., 405 and 445) and gate line segments (i.e., 400 and 430). Line segments 420 and 425 connect the gate line segments. In an alternative embodiment, the gate line segments are not centered in the gates of metal region 300.

In one embodiment, the line segments of FIG. 4 are offset from the boundaries of diffusion region 310 by a predetermined amount. In one embodiment, the offset is greater than, $$\frac{0.25\lambda}{NA},$$

where $\lambda$ is the wavelength of the light used and NA is the numerical aperture used. Thus, the offset is greater than the width of the gates. The line segments of FIG. 4 indicate the dimensions of a phase shifted region manufactured over diffusion region 310 as described in greater detail below. By defining the phase shifted region based on diffusion region 310, the phase shifting mask can be more easily defined than if the phase shifting mask is defined based on a gate or other region to be generated using phase shifting techniques.

Figure 5:
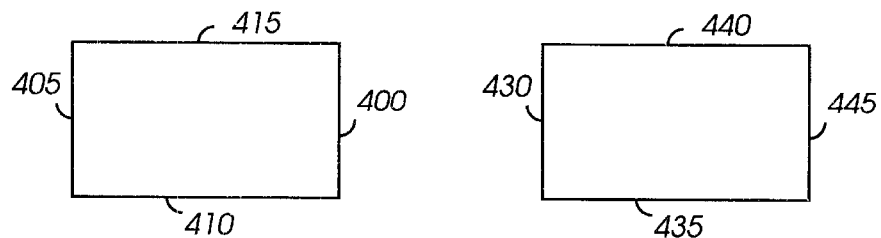
FIG. 5 is a phase shifting mask for the layout of FIG. 3 according to one embodiment of the invention.

FIG. 5 is a phase shifting mask for the layout of FIG. 3 according to one embodiment of the invention. In the embodiment described with respect to FIG. 5, the line segments described with respect to FIG. 4 are used to define the phase shifting mask to generate gates according to the invention.

Line segments 400, 405, 410 and 415 define a first region of exposure for a phase shifting mask. Line segments 430, 435, 440 and 445 define a second region of exposure for the phase shifting mask. In an alternative embodiment, offsets from the line segments of FIG. 5 are used to define the first and second regions of exposure.

Line segments 400, 405, 410 and 415 and line segments 430, 435, 440 and 445 define phase shifting regions within the phase shifting mask. In one embodiment, the line segments define a region that phase shifts light by 180 degrees while the neighboring regions do not shift the light. Alternatively, the region(s) external to the line segments can be 180 degree phase shifted regions and the internal regions can be zero degree phase shifted regions.

Other phase shifted and non-phase shifted regions can also be included in the phase shifting mask. In alternative embodiments, phase shifting other than zero degrees and 180 degrees can be used. The phase shift mask can also be used to provide additional structure for the metal layer other than the gates, or other regions, created using phase shifting techniques.

Figure 6:
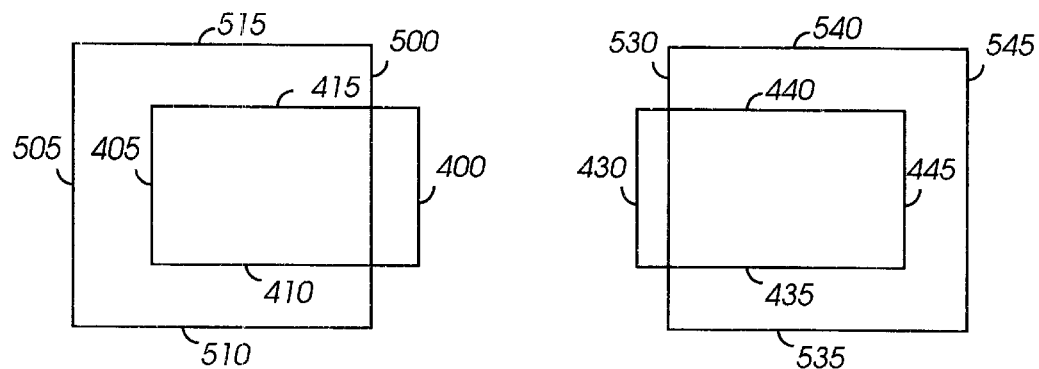
FIG. 6 is a trim mask for the layout of FIG. 3 according to one embodiment of the invention.

FIG. 6 is a trim mask for the layout of FIG. 3 according to one embodiment of the invention. The trimming regions eliminate the artifacts that are generated by the phase shifting mask that are not part of the transistor gate to be manufactured.

The trimming regions corresponding to the phase shifting regions of the phase shifting mask are defined by line segments 500, 505, 510 and 515 and by line segments 530, 535, 540 and 454. In one embodiment, the line segments that define the trimming regions are at a predetermined offset from the corresponding line segments that define the phase shifting regions. Other structural regions (not shown in FIG. 6) can also be included in the trimming mask.

Figure 7:
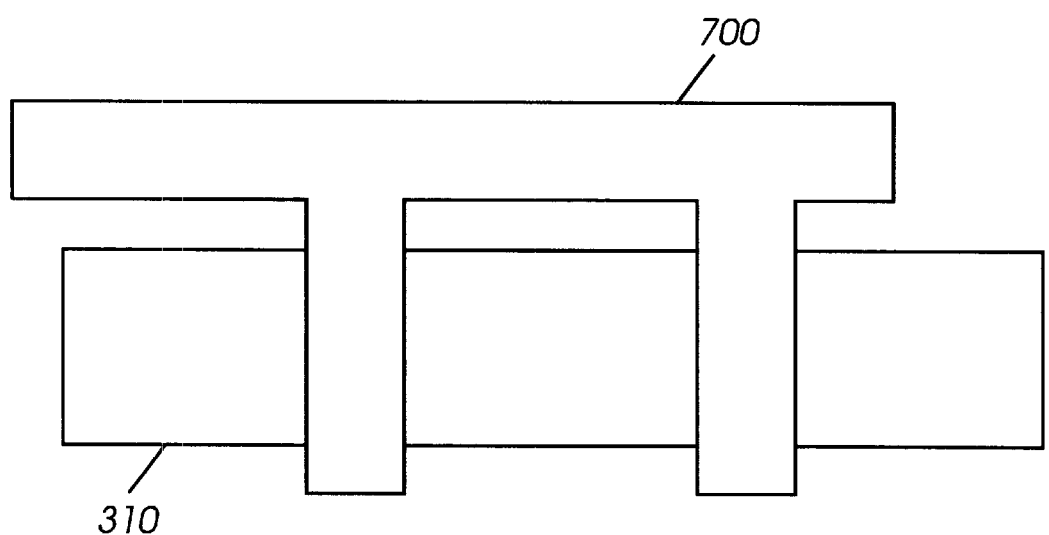
FIG. 7 is a resulting circuit based on the layout of FIG. 3.

FIG. 7 is a resulting circuit based on the layout of FIG. 3. Diffusion region 310 is the same size as the layout of FIG. 3. In one embodiment, the two transistor gates over diffusion region 310 have a reduced dimension as compared to the original circuit layout of FIG. 3. In one embodiment, the connection between the gates has a reduced dimension. Thus, some or all of the metal or polysilicon region 700 has a reduced dimension as compared to the circuit layout of FIG. 3.

Figure 8:
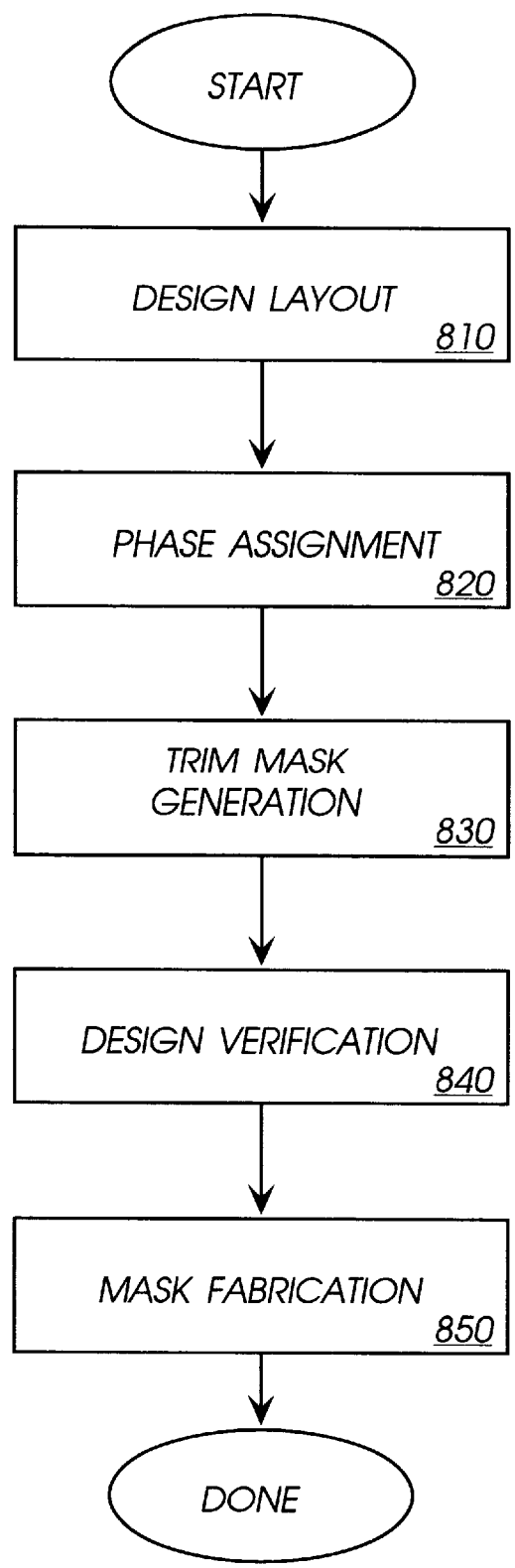
FIG. 8 is a flow diagram for generating phase shift and trim masks according to one embodiment of the invention.

FIG. 8 is a flow diagram for generating phase shift and trim masks according to one embodiment of the invention. A design layout is generated and/or accessed at 810. The design layout can be, for example, a GDS-II description of the circuit to be manufactured. Other layout formats can also be supported.

The design layout is accessed at 810. In one embodiment, the design layout is a circuit description in GDS-II format; however, other formats can also be used. The design layout describes the circuit design from which masks and/or reticles are designed to realize the circuit described by the design layout.

Phase assignments are made based on the design layout at 820. In one embodiment, the phase assignments are made to create gate structures having dimensions that are less than the minimum realizable dimension of the integrated circuit manufacturing process to be used.

The phase assignments are made, as described above, based on a circuit structure in a circuit layer other than the layer for which the phase shifted processing is to be used. For example, if phase shifting is to be used to create gate structures, the phase assignments for the gate structures are made based on the diffusion region over which the gate structure is to be manufactured. A phase shifting mask is generated based on the phase assignments.

A trim mask is generated at 830. The trim mask functions to remove artifacts created by the phase shifting mask. In one embodiment, the trim mask is based on the same circuit structure as the phase shifting mask. The trim mask can also define structure other than the structures created using the two mask phase shifting process described herein. For example, the trim mask can define metal or other connecting structures between the gate regions created using the phase shifting mask and the trim mask.

Design verification is performed at 840. In one embodiment, design verification is performed after phase assignments are made. Typically, design verification includes design rule checking and/or electrical continuity checking, which is referred to as layout versus schematic (LVS) checking. In one embodiment, artificial gate widths are used for design verification purposes because the physical gate width generated by the layout of the phase shifting mask can cause conventional design verifications to fail. Modifications to the design are made, if necessary, based on the design verification to match the original layout topology allowing conventional LVS checks to be executed. The multiple masks used to fabricate the integrated circuit are fabricated at 850.

Figure 9:
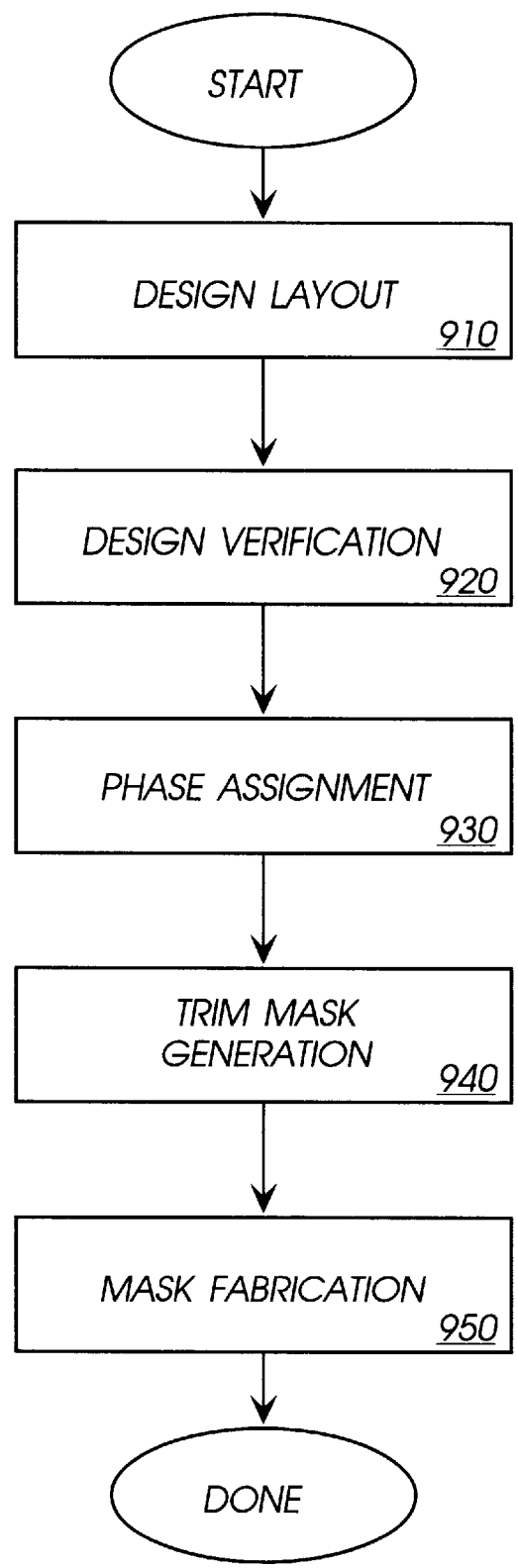
FIG. 9 is a flow diagram for generating phase shift and trim masks according to one embodiment of the invention.

FIG. 9 is a flow diagram for generating phase shift and trim masks according to one embodiment of the invention. The embodiment of FIG. 9 performs design verification prior to phase assignments. In this embodiment, the reduced gate widths do not cause the design verification to fail.

The design layout is accessed at 910. As described above, the layout can be in GDS-II format, or any other appropriate format. The design layout is used for design verification at 920. Because the design verification is performed on the original design layout, the reduced dimensions provided by the dual-mask phase shifting fabrication described above does not cause the design verification to fail.

Phase assignment is provided at 930. In one embodiment, the phase assignment is performed based on circuit structure in a different circuit layer than the layer for which the phase mask is to be used. A trim mask is generated, at 940, for the circuit layer corresponding to the phase assignment described above. The appropriate masks are fabricated at 950.

Figure 10:
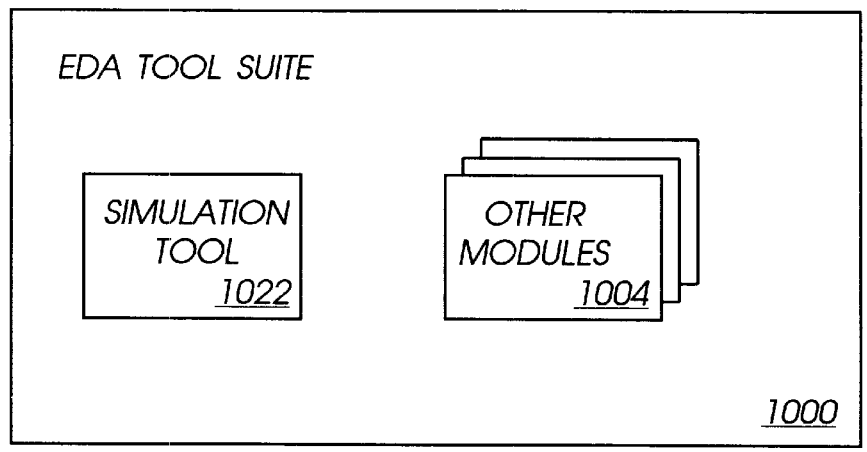
FIG. 10 illustrates an EDA tool incorporated with the simulation tool of the present invention in accordance with one embodiment is shown.

FIG. 10 illustrates an EDA tool incorporated with the simulation tool of the present invention in accordance with one embodiment is shown. As illustrated, EDA tool suite 1000 includes simulation tool 1002 incorporated with the teachings of the present invention as described earlier. Additionally, EDA tool suite 1000 includes other tool modules 1004. Examples of these other tool modules 1002 include but are not limited to synthesis module, layout verification module and so forth.

Figure 11:
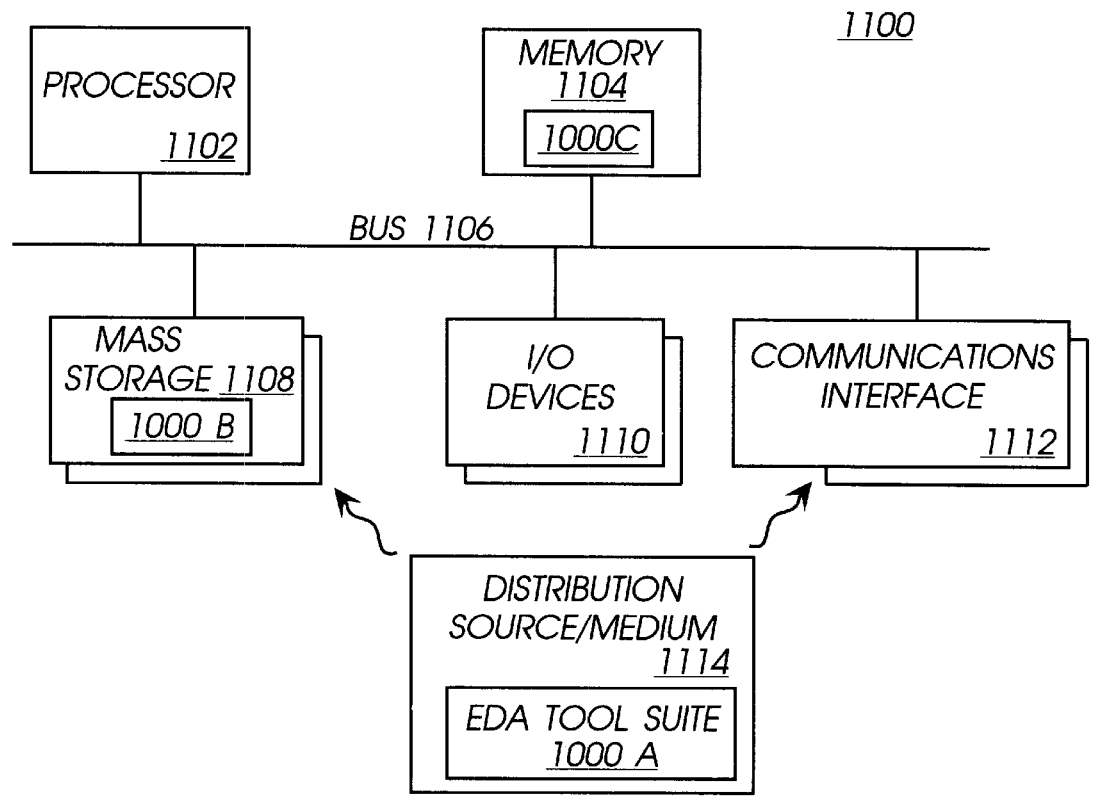
FIG. 11 illustrates one embodiment of a computer system suitable for use to practice the present invention.

FIG. 11 illustrates one embodiment of a computer system suitable for use to practice the present invention. As shown, computer system 1100 includes processor 1102 and memory 1104 coupled to each other via system bus 1106. Coupled to system bus 1106 are non-volatile mass storage 1108, such as hard disks, floppy disk, and so forth, input/output devices 1110, such as keyboard, displays, and so forth, and communication interfaces 1112, such as modem, LAN interfaces, and so forth. Each of these elements perform its conventional functions known in the art.

In particular, system memory 1104 and non-volatile mass storage 1108 are employed to store a working copy and a permanent copy of the programming instructions implementing the above described teachings of the present invention. System memory 1104 and non-volatile mass storage 1106 may also be employed to store the IC designs. The permanent copy of the programming instructions to practice the present invention may be loaded into non-volatile mass storage 1108 in the factory, or in the field, using distribution source/medium 1114 and optionally, communication interfaces 1112. Examples of distribution medium 1114 include recordable medium such as tapes, CDROM, DVD, and so forth. In one embodiment, the programming instructions are part of a collection of programming instructions implementing EDA tool 1000 of FIG. 10. The constitution of elements 1102–1114 are well known, and accordingly will not be further described.

In the foregoing specification, the invention has been described with reference to specific embodiments thereof. It will, however, be evident that various modifications and changes can be made thereto without departing from the broader spirit and scope of the invention. The specification and drawings are, accordingly, to be regarded in an illustrative rather than a restrictive sense.

What is claimed is:

1. A method of generating a set of masks/reticles for integrated circuit manufacture, the method comprising:

generating a first mask/reticle to define a phase-shifting region to define boundaries of a structure in a first layer of the integrated circuit, the phase-shifting region defined, at least in part, by boundaries of a region in a second layer of the integrated circuit;

generating a second mask/reticle to define a second region to define boundaries of a structure in the first layer of the integrated circuit, the second region defined, at least in part, by boundaries of the region in the second layer of the integrated circuit, the second mask/reticle further to remove artifacts generated by the first mask/reticle.

2. The method of claim 1 wherein the phase-shifting region is generated by destructive light interference.

3. The method of claim 1 wherein the first mask/reticle includes phase-shifting elements to define the phase-shifting region.

4. The method of claim 1 wherein the second mask/reticle further defines additional structural elements in the first integrated circuit layer.

5. The method of claim 1 wherein the region in the second layer of the integrated circuit is a diffusion region.

6. The method of claim 1 wherein the second mask/reticle does not include phase-shifting elements.

7. The method of claim 1 wherein the first mask/reticle and the second mask/reticle define a transistor gate.

8. The method of claim 1 wherein the second mask/reticle retains a topology of an original integrated circuit layout.

9. An article comprising a machine-readable medium having stored thereon sequences of instructions that when executed by one or more processors cause an electronic device to:

generate a first mask/reticle definition that defines a phase-shifting region to define boundaries of a structure in a first layer of the integrated circuit, the phase-shifting region defined, at least in part, by boundaries of a region in a second layer of the integrated circuit;

generate a second mask/reticle definition that defines a second region to define boundaries of a structure in the first layer of the integrated circuit, the second region defined, at least in part, by boundaries of the region in the second layer of the integrated circuit, the second mask/reticle further to remove artifacts generated by the first mask/reticle.

10. The article comprising a machine-readable medium of claim 9 wherein the phase-shifting region is generated by destructive light interference.

11. The article comprising a machine-readable medium of claim 9 wherein the first mask/reticle includes phase-shifting elements to create the phase-shifting region.

12. The article comprising a machine-readable medium of claim 9 wherein the sequences of instructions that generate the second mask/reticle further comprise sequences of instruction that define additional structural elements in the first integrated circuit layer.

13. The article comprising a machine-readable medium of claim 9 wherein the region in the second layer of the integrated circuit is a diffusion region.

14. The article comprising a machine-readable medium of claim 9 wherein the second mask/reticle does not include phase-shifting elements.

15. The article comprising a machine-readable medium of claim 9 wherein the first mask/reticle and the second mask/reticle define a transistor gate.

16. The article comprising a machine-readable medium of claim 9 wherein the second mask/reticle retains a topology of an original integrated circuit layout.

17. A computer data signal embodied in a data communications medium shared among a plurality of network devices comprising sequences of instructions that, when executed, cause one or more electronic systems to:

generate a first mask/reticle definition that defines a phase-shifting region to define boundaries of a structure in a first layer of the integrated circuit, the phase-shifting region defined, at least in part, by boundaries of a region in a second layer of the integrated circuit;

generate a second mask/reticle definition that defines a second region to define boundaries of a structure in the first layer of the integrated circuit, the second region defined, at least in part, by boundaries of the region in the second layer of the integrated circuit, the second mask/reticle further to remove artifacts generated by the first mask/reticle.

18. The computer data signal of claim 17 wherein the phase-shifting region is generated by destructive light interference.

19. The computer data signal of claim 17 wherein the first mask/reticle includes phase-shifting elements to create the phase-shifting region.

20. The computer data signal of claim 19 wherein the region in the second layer of the integrated circuit is a diffusion region.

21. The computer data signal of claim 17 wherein the sequences of instructions that generate the second mask/reticle further comprise sequences of instruction that define additional structural elements in the first integrated circuit layer.

22. The computer data signal of claim 17 wherein the second mask/reticle does not include phase-shifting elements.

23. The computer data signal of claim 17 wherein the first mask/reticle and the second mask/reticle define a transistor gate.

24. The computer data signal of claim 17 wherein the second mask/reticle retains a topology of an original integrated circuit layout.

25. A method of generating a set of masks/reticles for integrated circuit manufacture, the method comprising:

generating a phase-shifting mask/reticle to define boundaries of a gate region in a metal layer of the integrated circuit, the boundaries of the gate region defined, at least in part, by boundaries of a diffusion region in a second layer of the integrated circuit;

generating a second mask/reticle to define boundaries of a clean-up region in the metal layer of the integrated circuit, the boundaries of the clean-up region defined, at least in part, by boundaries of the diffusion region in the second layer of the integrated circuit, the second mask/reticle further to remove artifacts generated by the first mask/reticle.

26. The method of claim 25 wherein the second mask does not include phase-shifting elements.

* * * * *